(12) United States Patent
Celii et al.

(10) Patent No.: US 6,521,042 B1
(45) Date of Patent: Feb. 18, 2003

(54) SEMICONDUCTOR GROWTH METHOD

(75) Inventors: Francis G. Celii, Dallas, TX (US);
Alan J. Katz, Dallas, TX (US);
Yung-Chung Kao, Dallas, TX (US);
Theodore S. Moise, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1006 days.

(21) Appl. No.: 08/667,660

(22) Filed: Jun. 21, 1996

Related U.S. Application Data

(63) Continuation of application No. 08/382,324, filed on Feb. 1, 1995, now Pat. No. 5,985,025.

(51) Int. Cl.[7] ............................................. C30B 25/16
(52) U.S. Cl. .................... 117/201; 117/202; 117/85; 117/86; 118/715
(58) Field of Search ................ 117/85, 86, 201, 117/202; 118/715

(56) References Cited

U.S. PATENT DOCUMENTS

| | | | |
|---|---|---|---|
| 4,332,833 A | | 6/1982 | Aspnes et al. |
| 5,091,320 A | | 2/1992 | Aspnes et al. |
| 5,171,399 A | * | 12/1992 | Brennan et al. ............... 117/86 |
| 5,277,747 A | * | 1/1994 | Aspnes ......................... 117/86 |
| 5,313,044 A | | 5/1994 | Massoud et al. |
| 5,399,521 A | * | 3/1995 | Celii et al. ..................... 117/84 |
| 5,400,739 A | * | 3/1995 | Kao et al. ...................... 117/86 |
| 5,772,758 A | * | 6/1998 | Collins et al. ................. 117/86 |

OTHER PUBLICATIONS

"Real–time monitoring of resonant–tunneling diode growth using *spectroscopic ellipsometry*," by F. G. Celii, Y.–C. Kao, A. J. Katz, and T. S. Moise, 8257a Journal of Vacuum Science & Technology A, 13(1995) May/Jun., No. 3, Part 1, woodbury, NY.

* cited by examiner

*Primary Examiner*—Robert Kunemund
(74) *Attorney, Agent, or Firm*—W. Daniel Swayze, Jr.; W. James Brady; Frederick J. Telecky, Jr.

(57) ABSTRACT

Molecular beam epitaxy (202) with growing layer thickness control (206) by feedback of mass spectrometer (204) signals based on a process model. Examples include III-V compound structures with multiple AlAs, InGaAs, and InAs layers as used in resonant tunneling diodes.

6 Claims, 8 Drawing Sheets

US 6,521,042 B1

SEMICONDUCTOR GROWTH METHOD

This is a continuation, of application Ser. No. 08/382,324, filed Feb. 01, 1995, now U.S Pat. No. 5,985,025.

BACKGROUND OF THE INVENTION

The invention relates to electronic devices, and, more particularly, to fabrication methods for semiconductors.

The continual demand for enhanced transistor and integrated circuit performance has resulted in improvements in existing devices, such as silicon bipolar and CMOS transistors and gallium arsenide MESFETs, and also the introduction of new device types and materials. In particular, the demand for low noise and high power at microwave frequencies has led to high electron mobility transistors (HEMTs) made of combinations of gallium arsenide (GaAs) plus aluminum gallium arsenide ($Al_xGa_{1-x}As$) and pseudo-momrphic HEMTs made of combinations of $Al_xGa_{1-x}As$ and indium gallium arsenide ($In_xGa_{1-x}$ As) in a MESFET-like structure. Similarly, heterojunction bipolar transistors (HBTs) made of wide bandgap emitters with narrow bandgap bases (e.g., $Al_xGa_{1-x}As$ emitters with GaAs bases or silicon emitters with silicon-germanium bases) overcome the all-silicon bipolar transistor limitation on base doping levels due to carrier injection into the emitter.

Further, scaling down device sizes to enhance high frequency performance leads to observable quantum mechanical effects such as carrier tunneling through potential barriers. This led to development of alternative device structures such as resonant tunneling diodes and resonant tunneling hot electron transistors which take advantage of such tunneling phenomena. For example, Mars et al., Reproducible Growth and Application of AlAs/GaAs Double Barrier Resonant Tunneling Diodes, 11 J.Vac.Sci.Tech.B 965 (1993), and Özbay et al, 110-GHz Monolithic Resonant-Tunneling-Diode Trigger Circuit, 12 IEEE Elec.Dev.Lett. 480 (1991), each use two AlAs tunneling barriers imbedded in a GaAs structure to form a quantum well resonant tunneling diode. The quantum well may be 4.5 nm thick with 1.7 nm thick tunneling barriers. Resonant tunneling transistors improve upon resonant tunneling diodes by providing gain and come in a variety of types. In particular, HBTs and hot electron transistors (HETs) with one or more double barrier quantum well energy filters located in their emitters yield resonant tunneling bipolar transistors (RTBTs) and resonant tunneling hot electron transistors (RHETs), respectively. Futatsugi et al, Resonant Tunneling Bipolar Transistors Using InAlAs/InGaAs Heterostructures, 65 J.Appl.Phys. 1771 (1989), describes the characteristics of an RTBT.

The foregoing devices all require structures with sharp heterojunctions and the resonant tunneling devices further require multiple thin (~2 nm thick) compound semiconductor layers. Molecular beam epitaxy (MBE) provides the typical fabrication method for such structures.

FIG. 1 illustrates a simple MBE system 100 which includes a high vacuum chamber 102 with a rotating wafer holder 104 and effusion cells 106 aimed at the wafer holder, plus various optional detector systems such as reflection high energy electron diffraction (RHEED) 110–111, ellipsometry 112–113, and line-of-sight in situ reflection mass spectrometer (REMS) 115. Wafers are typically circular with two-inch or three-inch diameter and 0.5 mm thickness. Wafer holder 104 includes a heater and thermocouple to control the temperature of wafer 120, typically in the range of 400 to 700° C. The pump maintains chamber 102 at a very low pressure, typically on the order of $5 \times 10^{-9}$ torr during growth. This pressure implies atoms and molecules have a mean free path larger than the diameter of chamber 102.

Basically, the operation of MBE system 100 to grow layers on wafer 120 is as follows. First, effusion cells 106 are charged with quantities of the species required to grow the desired layers on wafer 120; for example, one effusion cell may contain aluminum (Al), another gallium (Ga), a third indium (In), and a fourth arsenic (As). This would be sufficient to grow layers of compound semiconductors such as GaAs, $In_xGa_{1-x}As$, AlAs, $Al_xGa_{1-x}As$, and so forth. Then to grow a layer of GaAs, the shutters of the gallium and the arsenic effusion cells are opened and beams of gallium and arsenic (perhaps in the form of $As_2$ or $As_4$) impinge on wafer 120. Ideally, the atoms/molecules of the impinging Ga and As beams stick to and migrate on the surface of wafer 120 and react to form GaAs. Due to the volatility of arsenic, an arsenic over-pressure is maintained deter decomposition of the growing arsenic compounds. Thus, the arsenic beam may have a flux a thousand times that of the gallium, aluminum, or indium beams.

The detector systems such as RHEED permit (for a non-rotating wafer) assessment of the crystal quality and growth rate of the surface layer of wafer 120, and ellipsometry allows layer thickness measurements. REMS permits evaluation of the sticking coefficient and desorption of one of the elements as a function of temperature. See Brennan et al, Application of Reflection Mass Spectrometry to Molecular-Beam Epitaxial Growth of InAlAs and InGaAs, 7 J.Vax.Sci.Tech.B 277 (1989); Brennan et al, U.S. Pat. No. 5,171,399; and Brennan et al, Reactive Sticking of $As_4$ during Molecular Beam Homoepitaxy of GaAs, AlAs, and InAs, 10 J.Vac.Sci.Tech.A 33 (1992). Also, see U.S. Pat. No. 5,096,533.

However, MBE growth of layers has problems including accurate control of layer thickness. The layer thickness of the electronic device is important in determining the electrical characteristics of the electronic devices. The typical growth procedure determines average growth rates, and then synchronizes the opening and closing of effusion cell shutters to give nominal layer thicknesses based on the average growth rates. Because the average growth rates are often determined with thick-layer growths and post-growth analysis, extrapolation of these results to growth of thin layers can result in large deviations from nominal thickness values. The true layer thickness can also differ from the nominal due to fluctuations in effusion cell flux or change in growth conditions such as wafer surface temperature. A method is needed for accurate determination of growth rate during layer deposition, such that each of the layer thicknesses can be precisely controlled.

SUMMARY OF THE INVENTION

The present invention provides MBE growing layer thickness control by feedback analysis from measurements of the reflected flux of growth species.

The present invention grows or produces a series of multi-layer structures each having one or more structure devices mounted on the multi-layered structures. The physical characteristics of these devices are measured, including the thickness of the first barrier, the second barrier and the quantum well. From these physical characteristics, desired electrical characteristics of the multi-layered structure are predicted. Actual electrical characteristics of the multi-layered structure are determined, and the desired or predicted electrical characteristics are compared with the actual electrical characteristics with modeling techniques to obtain a model of the multi-layered structures. This model is used in conjunction with the growth of the layers of the device. More specifically, as the layers are being grown, the thickness of the layers are measured, and these thicknesses are used to correct the thickness of layers that are yet to be grown. In this way, the model may be used to obtain the desired or target electrical characteristics by correcting for the over or under growth of layers which have been previously grown.

Other Major Class to be used with the present invention include optical materials, which don't have device structures or electrical characteristics, but optical characteristics (e.g. high reflectivity at a target wavelength).

DESCRIPTION OF THE PREFERRED EMBODIMENTS

Overview

Figure 1:
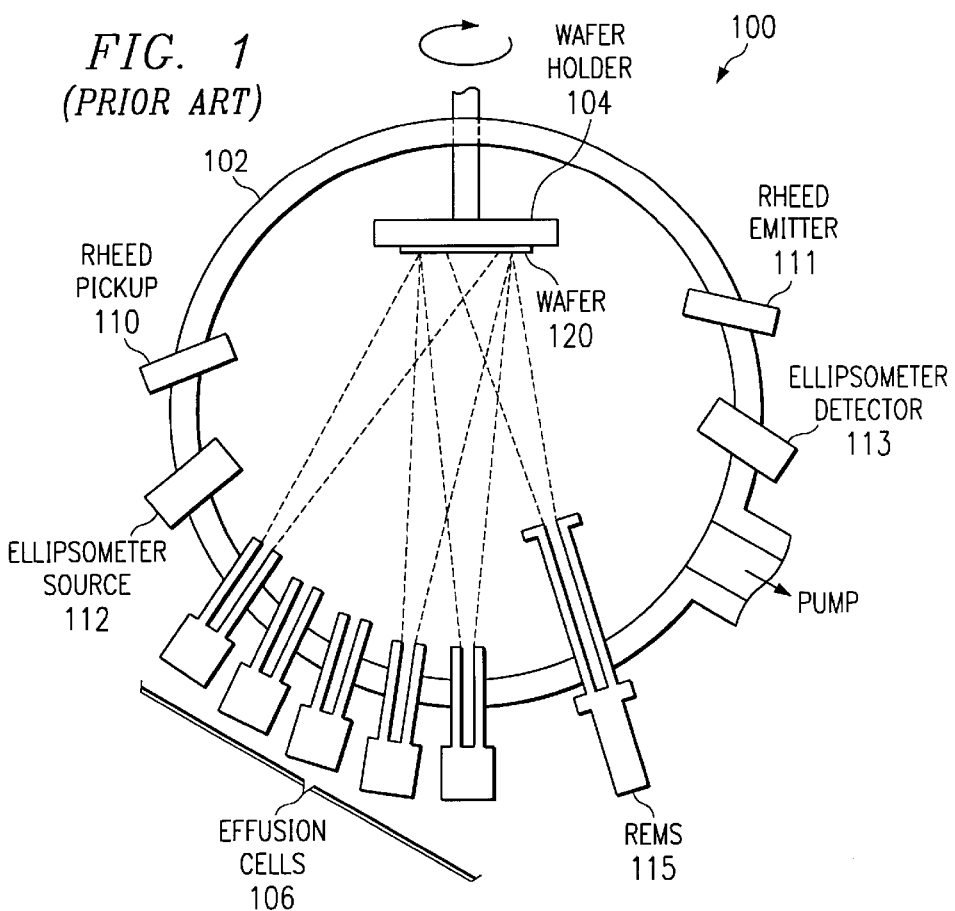
FIG. 1 illustrates a known MBE machine.
Figure 2:
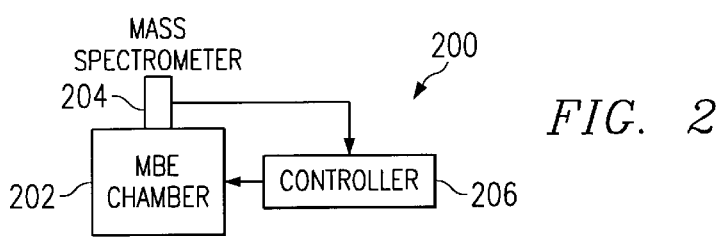
FIG. 2 shows in block diagram form an embodiment of the present invention.

FIG. 2 shows the MBE system of the present invention in block format, generally denoted by reference numeral 200, as including MBE growth chamber 202 with 204 and controller 206 which drives the molecular beam effusion cells. MBE chamber 202 and mass spectrometer 204 may have the structure as shown in FIG. 1. Controller 206 may include a personal computer (PC) programmed to control the effusion cell shutters in response to computations performed on the output signals of mass spectrometer 204 and in response to a predetermined model. Mass spectrometer 204 output signals indicating the amount of each element impinging on the wafer in MBE chamber 202, and thus combining the signals with a process model permits determination of layer thickness as the layers of the device are currently being grown and one layer thicker yet to be grown. Thus controller 206 may be programmed to grow a multi-layer structure with set layer thicknesses, and the effusion cell control derives from actual layer thickness via the mass spectrometer signal feedback rather that from a timed growth. This avoids the problem of using an average growth rate for all thickness layers despite possibly nonuniform growth rates.

Figure 3:
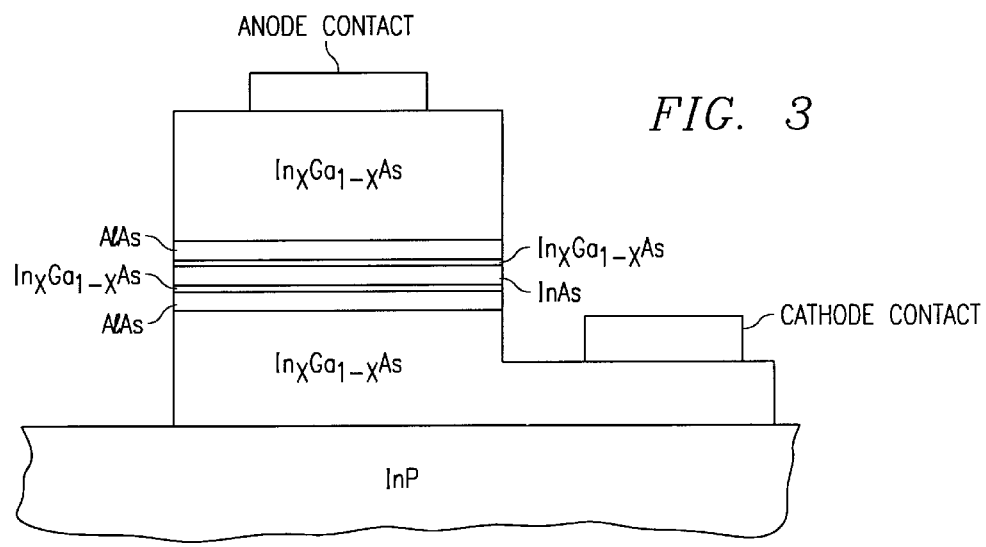
FIG. 3 illustrates a resonant tunneling diode.

FIG. 3 illustrates a device. that may be grown in accordance with the teaching of the present invention.

Figure 8:
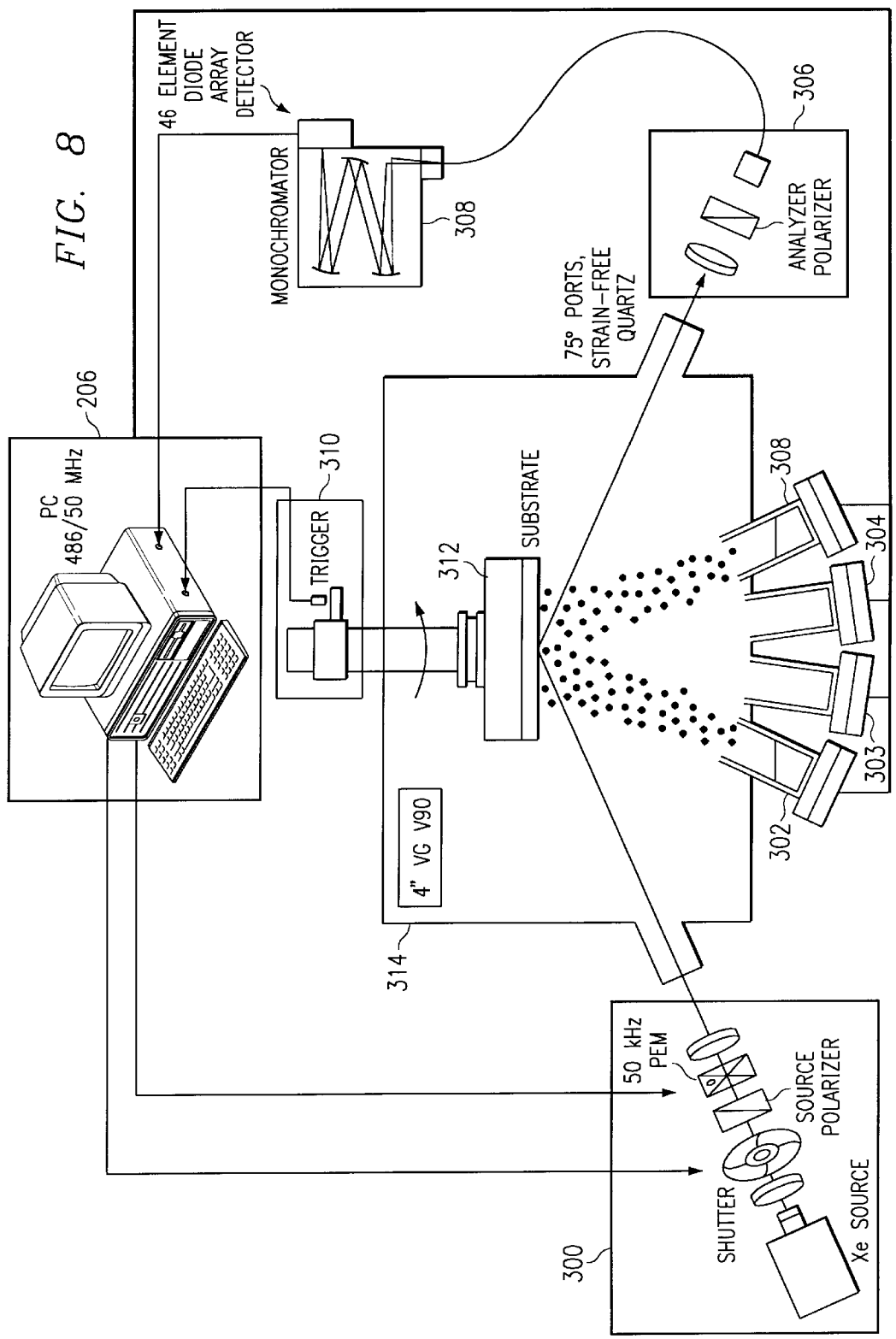
FIG. 8 illustrates another "MBE" machine.

The same feedback real time control may also be achieved in other types of MBE systems, such as illustrated in FIG. 8. FIG. 8 illustrates that controller 206, which may be a PC or mini computer, micro computer or general computer, which may be a stand-alone unit or may be on a distributed system. The controller 206 is coupled to effusion cells to control the operation or the effusion 302, 303, 304 and 305 cells by opening and closing the shutters of the effusion cells. The controller 206 is coupled to the spectroscopic ellipsometer to control the operation of the ellipsometer by starting and stopping the ellipsometer to measure the thickness of the layer being grown. The thickness data from the ellipsometer is transmitted to the controller 206. The layer being grown may be grown by integration of the growth rate data in the controller and the controller controling the operation of the effusion cells by the thickness volume that results from the integration of the growth rate data More accurate growth results from this method.

Figure 4:
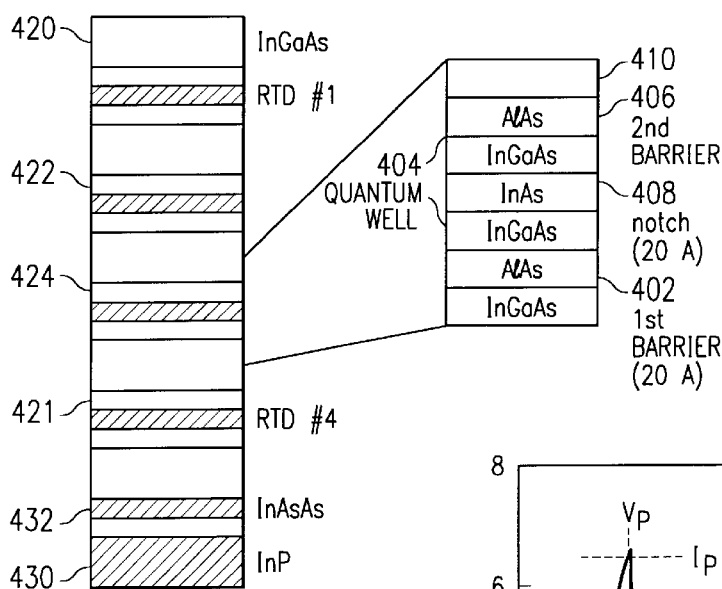
FIG. 4 illustrates an RTD device.
Figure 5:
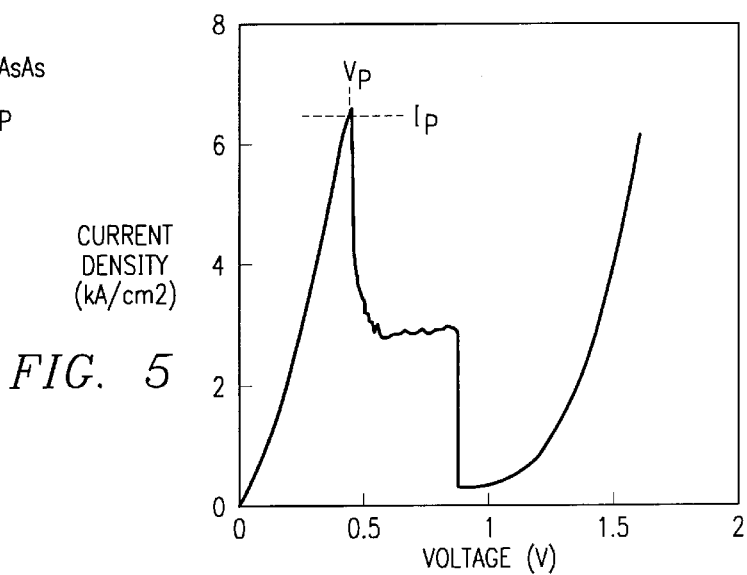
FIG. 5 illustrates the relationship between the voltage and the current density.

FIG. 4 illustrates in the left-most portion the RTD structure 412 having four RID devices (420, 422, 424 and 426) stack-mounted on the RTD structure 412. The right-most portion of FIG. 4 illustrates a single RTD device 410. The RTD device 410 includes a first barrier 402, a quantum well 404 and a second barrier 406. Additionally, the RTD device 410 includes a notch 408. The thickness of the first barrier 402 may be approximately 20 Å, and the thickness of the notch 408 is approximately 20 Å. The electrical characteristics of the RTD device 412 include peak voltage, peak current and valley current. These electrical characteristics of the RID device 412 are determined by many factors including the thickness of specific layers. For example, the peak current ($I_p$) of the RTD structure 412 is mainly determined by the thickness of the second barrier 406 of the RID device 420. However, the peak current ($I_p$) of the RTD device 410 is determined to a lesser degree from the thickness of quantum well 404 of the RTD device 410 and the thickness of the first barrier 402 of the RID device 410. The peak voltage ($V_p$) of the RID device 410 is determined primarily by interface roughness of barriers 402 or 406. FIG. 5 illustrates characteristics of a typical RTD device comparing voltage with current density.

Figure 6:
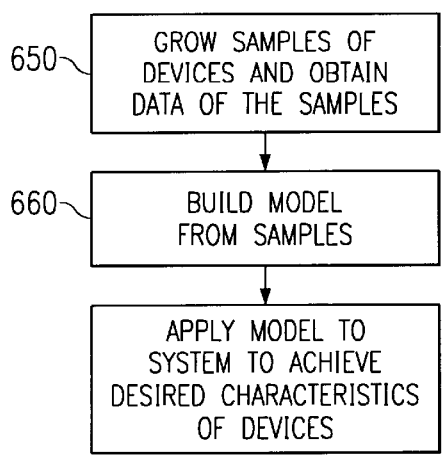
FIG. 6 illustrates a process step of the present invention.

The method to prepare an epitaxial wafer structure for an RID device 410 is explained as follows. A two-inch diameter indium phosphide (InP) wafer is mounted on a rotating wafer holder 312 in chamber 314. The chamber 314 is evacuated, and the surface oxide of the InP was desorbed by heating to 550° C. for two minutes under $As_4$ flux. A series of sample RTDs were grown as illustrated in block 650 of FIG. 6. The vertically integrated stacks of four consecutively-grown RTDs (420, 422, 424 and 426) are included with the RID structure 412. This RTD structure 412 includes two AlAs barriers (approximately 20 Å thick) sandwiched between a quantum well region including a lattice-matched InGaAs and a InAs-notched layer (approximately 20 Å thick), all undoped. Lattice-matched $In_{0.53}Ga_{0.47}As$ (432) and $In_{0.052}Al_{0.48}As$ (434) buffer layers ($n^{++}$-doped at $5\times10^{18}$ cm$^{-3}$Si) were deposited on an oxide-desorbed Inp substrate. The 2,000 Å spacer layers between the RTD devices included to 500 Å and $n^+$-layers ($1\times10^{18}$cm$^{-3}$) and a central 1,000 Å$n^{++}$-layer ($5\times10^{18}$ cm$^{-3}$) 436.

In order to study RTD perimeter variations and obtain the process model as illustrated in block 650, a sample set of twenty-eight RTD devices in seven RID structures were designed to build a linear model for eight variables. The variables studied were: AlAs barrier, InGaAs well and InAs well thickness; AlAs and InAs growth rates, InGaAsn+-spacer or composition (to alter strain conditions) and the InAsV/III ratio and growth temperature. Nominal growth rates were 2.4, 0.8 to 1.2, and 0.6 to 1.0 Å/s for $In_{0.53}Ga_{0.47}As$, AlAs and InAs, respectively, at the standard growth temperature of 450° C. Target thicknesses were: 6, 7 or 8 monolayers (ML) for AlAs, 5, 6 or 7 ML for the InAs notch and 4, 5, or 6 ML for the two InGaAs quantum well layers. Table 1 illustrates the target structure for each RID device.

controller 206 starts the growth by simultaneously opening the arsenic, indium and gallium effusion cell shutters of the cells 302, 303, 304 and 305 by transmitting a control signal to each of the cells. The arsenic effusion cell operating temperature provides a beam flux about one hundred times greater than the fluxes of other effusion cells at operating temperatures. The indium and gallium cells operate at temperatures to provide an indium and gallium beam ratio of 53 to 47 (so that InGaAs grown will always be $In_{0.53}Ga_{0.47}As$).

The phase-modulated spectroscopic ellipsometer (SE) including a light source 300, a collector 306 and a monochromator 308 are used to determine the thickness of the layer being formed on the holder 312. The light source 300 may include a Xe source of light. The Xe source is linearly polarized to emit both P phase light and S phase light and

TABLE 1

Target structures and growth conditions for each RTD in this study.

| Run #-RTD # (1 = top) | AlAs Thick. (ML) | InGaAs Thick. (ML) | InAs Thick. (ML) | InAs Temp (C) | Normalized QWell Growth Rate | V/III Ratio | Buffer In Fraction | Normalized AlAs Growth Rate |
|---|---|---|---|---|---|---|---|---|
| 451-1 | 6 | 6 | 7 | 400 | 0.6 | 1.8 | 0.51 | 1.2 |
| 451-2 | 6 | 4 | 5 | 400 | 0.6 | 1.4 | 0.51 | 0.8 |
| 451-3 | 6 | 4 | 5 | 450 | 1.0 | 1.8 | 0.55 | 1.2 |
| 451-4 | 8 | 6 | 7 | 450 | 0.6 | 1.4 | 0.51 | 0.8 |
| 462-1 | 6 | 4 | 5 | 400 | 0.6 | 1.4 | 0.51 | 0.8 |
| 462-2 | 8 | 4 | 5 | 450 | 1.0 | 1.4 | 0.51 | 1.2 |
| 462-3 | 8 | 6 | 7 | 450 | 1.0 | 1.8 | 0.55 | 1.2 |
| 462-4 | 8 | 4 | 5 | 450 | 0.6 | 1.8 | 0.55 | 0.8 |
| 466-1 | 8 | 4 | 7 | 400 | 1.0 | 1.4 | 0.55 | 0.8 |
| 466-2 | 7 | 5 | 6 | 425 | 0.8 | 1.6 | 0.53 | 1.0 |
| 466-3 | 8 | 6 | 7 | 450 | 0.6 | 1.4 | 0.51 | 0.8 |
| 466-4 | 6 | 6 | 5 | 450 | 0.6 | 1.8 | 0.51 | 1.2 |
| 467-1 | 7 | 5 | 6 | 425 | 0.8 | 1.6 | 0.53 | 1.0 |
| 467-2 | 7 | 5 | 6 | 425 | 0.8 | 1.6 | 0.53 | 1.0 |
| 467-3 | 7 | 5 | 6 | 425 | 0.8 | 1.6 | 0.53 | 1.0 |
| 467-4 | 7 | 5 | 6 | 425 | 0.8 | 1.6 | 0.53 | 1.0 |
| 471-1 | 6 | 4 | 5 | 400 | 1.0 | 1.8 | 0.55 | 1.2 |
| 471-2 | 8 | 6 | 5 | 400 | 0.6 | 1.4 | 0.55 | 1.2 |
| 471-3 | 6 | 4 | 7 | 450 | 1.0 | 1.8 | 0.51 | 0.8 |
| 471-4 | 6 | 4 | 7 | 450 | 0.6 | 1.4 | 0.55 | 1.2 |
| 475-1 | 8 | 6 | 5 | 400 | 1.0 | 1.8 | 0.51 | 0.8 |
| 475-2 | 6 | 4 | 7 | 450 | 0.6 | 1.4 | 0.55 | 1.2 |
| 475-3 | 6 | 6 | 5 | 450 | 1.0 | 1.4 | 0.55 | 0.8 |
| 475-4 | 8 | 6 | 7 | 450 | 1.0 | 1.8 | 0.55 | 1.2 |
| 482-1 | 6 | 4 | 5 | 400 | 1.0 | 1.8 | 0.55 | 1.2 |
| 482-2 | 7 | 5 | 6 | 425 | 0.8 | 1.6 | 0.53 | 1.0 |
| 482-3 | 7 | 5 | 6 | 450 | 1.0 | 1.8 | 0.53 | 1.0 |
| 482-4 | 8 | 6 | 7 | 450 | 1.0 | 1.8 | 0.55 | 1.2 |
| 784-1 | 6 | 5 | 7 | 450 | 1.0 | 2.0 | 0.53 | 1.0 |
| 784-2 | 8 | 6 | 6 | 450 | 1.0 | 2.0 | 0.53 | 1.0 |
| 784-3 | 7 | 7 | 4 | 450 | 1.0 | 2.0 | 0.53 | 1.0 |
| 784-4 | 7 | 4 | 5 | 450 | 1.0 | 2.0 | 0.53 | 1.0 |

The RTD stacks were processed and I–V curves were obtained for each RTD.

FIG. 5 illustrates the peak current density and peak voltage of the RTD device for one bias; however, in actuality each device has two resonant peaks, one for forward bias and the other for reverse bias. Although not shown, the mirror image of the relationship illustrated in FIG. 5 would appear in the third quadrant. The effusion cells 302, 303, 304 and 305 are heated to operating temperatures. Generally these temperatures are maintained throughout the growth although in other embodiments the controller 206 could adjust the effusion cell temperatures to adjust the beam fluxes.

Once the effusion cells 302, 303, 304 and 305 are at operating temperature (which will be detected by the mass spectrometer due to the leakage of effusion cell shutters), passes through shutters which are controlled by the controller 206, and includes a 150W Xe lamp, a source polarizer and a photoelastic modulator (PEM including a 50 kilohertz PEM) and finally with strain-free quartz windows and lens to mildly focus the light. The polarized lamp is reflected from a growth surface of holder 312. The ports of chamber 314 may be mounted at an angle or 75% from the surface normal which results in an elliptical probed area of 10×25 mm. The specular beam reflected from the growth surface is collected in the collector 306 through a second strain-free quartz and a second fixed polarizer and a 0.32 m monochromator 308, which detects the specular beam with a 46-element Si diode array detector spanning 4074 to 8532 Å. The holder 312 may rotate at 20 rpm with the waveform acquisition triggered through the controller 206 simultaneously with the wafer rotation minimizing problems resulting from substrate wobble. The light from the Xe source alternates with the P polarized light and the S polarized light.

The Ψ, which is the ratio between the angle of the P polarized light and the angle of the S polarized light, and Δ, which is the rotation of linear polarization angle values, which describe the complex reflection ratio given by:

$$R_p/R_s = P = \tan \Psi \exp(i\Delta), \quad (1)$$

where $R_p$ is the p-phase reflectance and where $R_s$ is the s-plan reflectance.

These Ψ and Δ values were extracted at each wavelength from the DC, fundamental and first harmonic intensities ($I_0$, $I_w$ and $I_{2w}$) of the 50 kHz PEM modulation using fast waveform digitization and Fourier transform analysis, and the following relations:

$$I_w = I_0 \sin 2\Psi \sin \Delta \quad (1a)$$

$$I_{2w} = I_0 \sin 2\Psi \cos \Delta \quad (1b)$$

Figure 11:
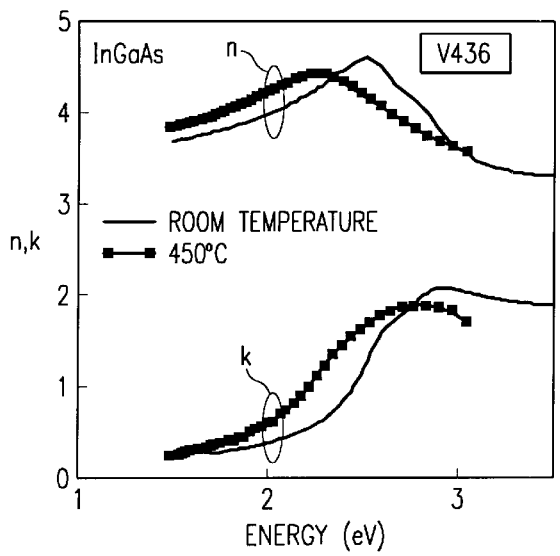
FIGS. 11 and 12 illustrate optical constants of lattice-matched InGaAs on InPn strain AlAs on InP.
Figure 12:
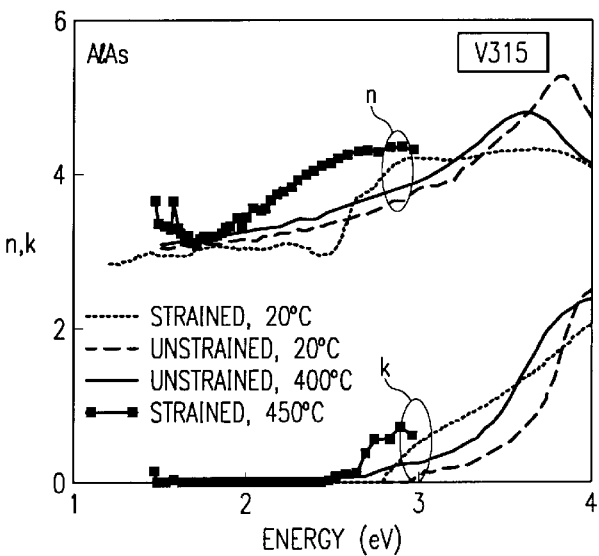

Analysis of the SE data was made using growth-temperature (450° C.) optical constants which are shown in FIGS. 11 and 12. Fitting of the (Ψ, Δ) data to structural models (described below) and these optical constants was accomplished using error minimization techniques for found in the WVASE analysis software.

RTD Monitoring

Figure 13:
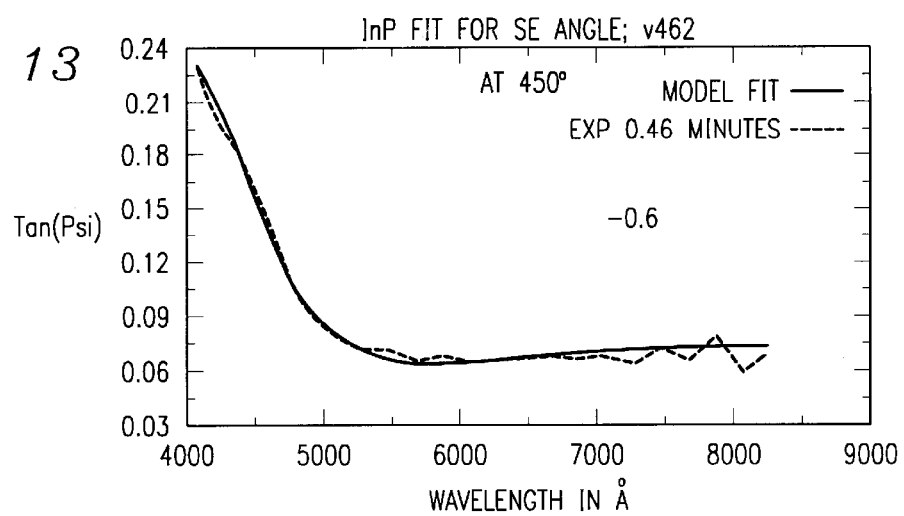
FIGS. 13 and 14 illustrate SE data and a fit for oxide free IP surface.
Figure 14:
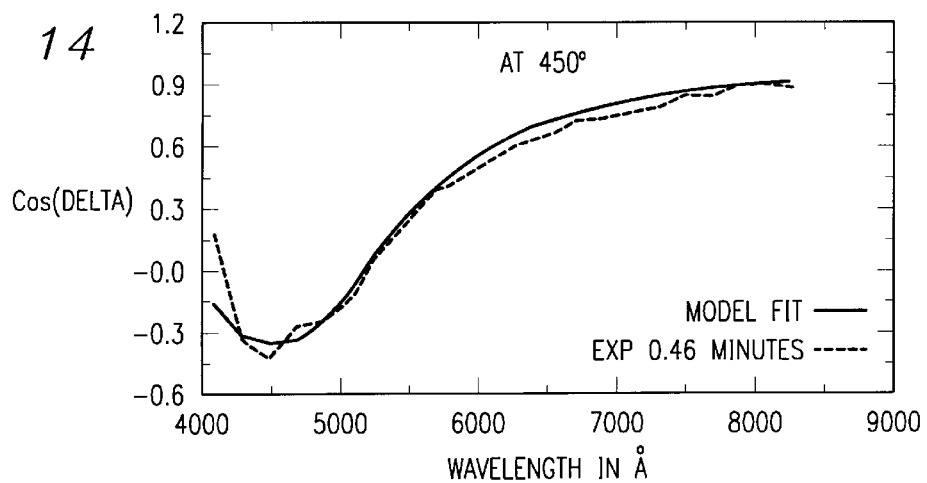

Spectra obtained from the oxide-desorbed InP substrate were fitted to determine the SE beam angle of incidence, minimizing the difference in Ψ and Δ values between observed and calculated. For the example spectra shown in FIGS. 13 and 14, a value of 76.12° was determined for the angle of incidence by fitting this angle to the InP optical constants, and fixing the angle at this value for analysis of subsequent layer growth for this sample.

Figure 15:
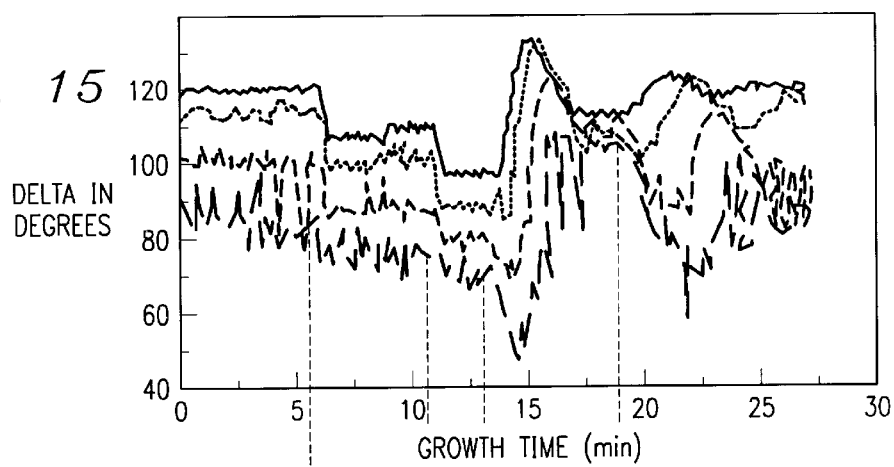
FIGS. 15, 16, and 17 illustrate in situ SE and REMS data during RTD growth.
Figure 16:
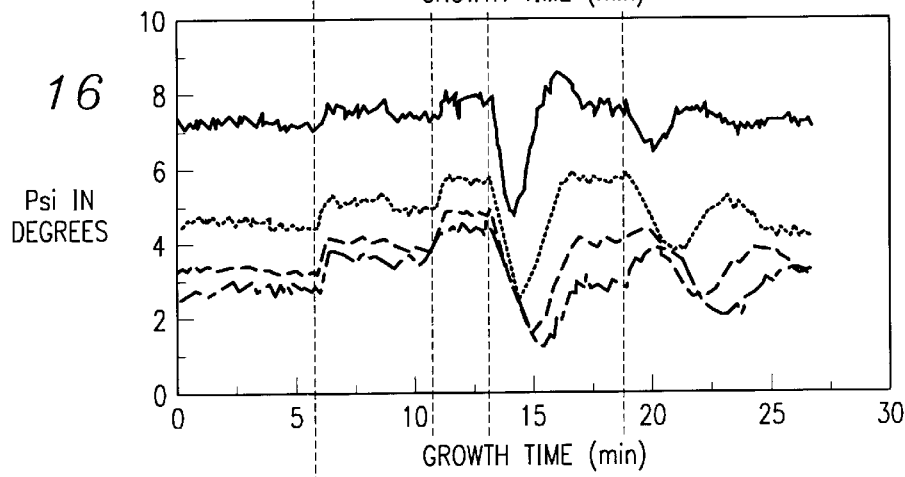
Figure 17:
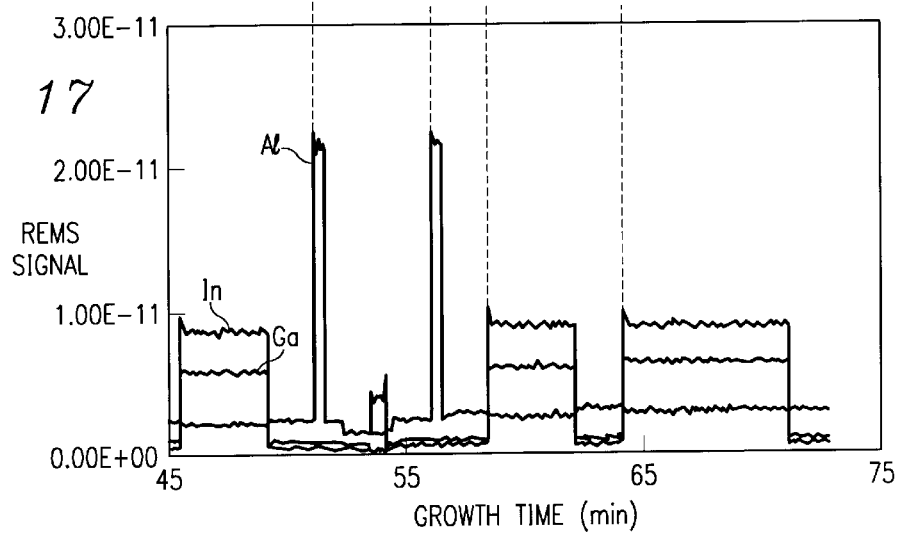

Sensor data from in situ growth monitoring of the RTD active region is shown in FIGS. 15, 16 and 17. In addition to the data from the spectroscopic ellipsometer SE (only some of the 23 sampled wavelengths are shown), REMS data, referring to FIG. 17, indicate the position of shutter openings. The SE data show sensitivity to AlAs barrier and InGaAs spacer layer deposition, while the well region results in much smaller spectral changes.

Figure 18:
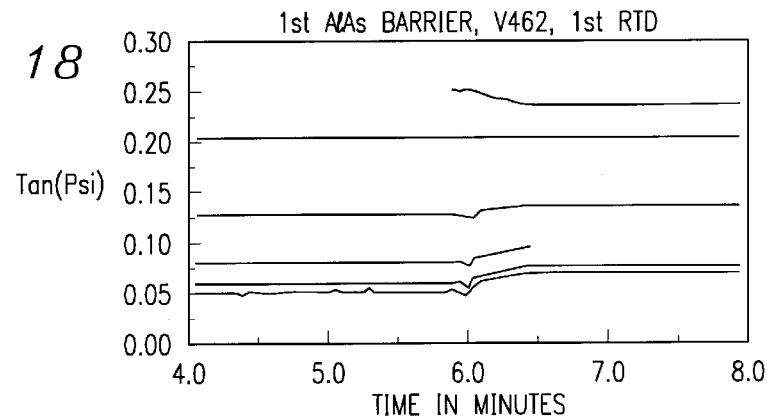
FIGS. 18 and 19 illustrate SE data and model fit for growth of a single AlAs.
Figure 19:
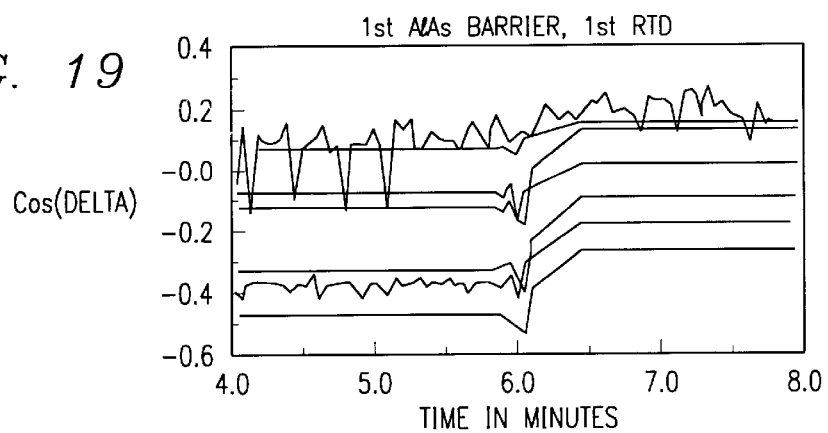

FIGS. 18 and 19 show post-growth analysis of an AlAs barrier growth, using the strained AlAs optical constants of FIG. 12. With growth interruptions before and after each barrier, the layer thicknesses (but not the growth rate) can be well-determined because the total change in Ψ and Δ values is accurately fit.

Figure 20:
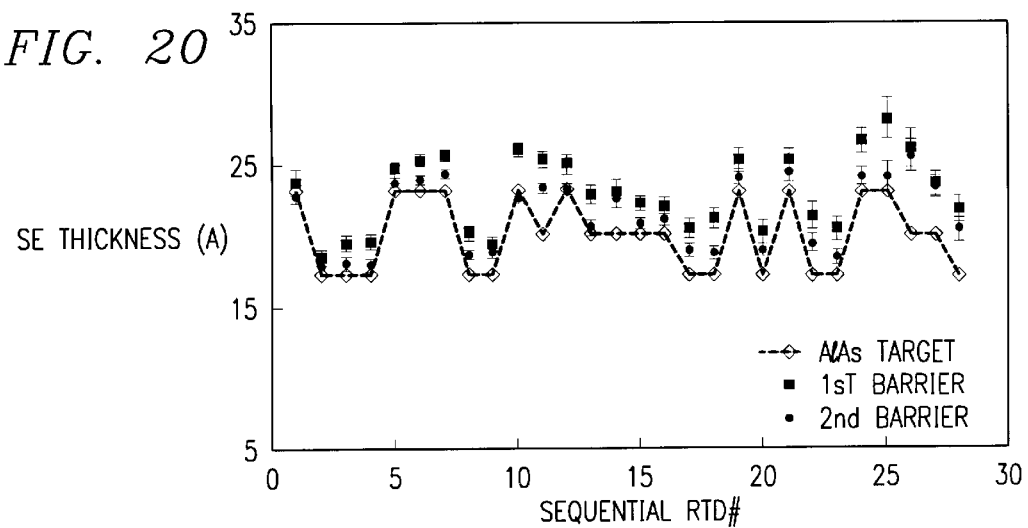
FIG. 20 illustrates the relationship between SE thickness and each of the RTD sample set.

Summary of the AlAs barrier thicknesses determined by post-growth analysis of the in situ data are plotted in FIG. 20. Since there are two barriers for each RTD, there are a total of 56 data points. The nominal barrier thicknesses are also shown in FIG. 20. The SE-determined, or actual thicknesses, in general, followed the trend of desired values. The second barrier of each RTD pair is consistently thinner than the first barrier, consistent with electrical measurements in FIG. 21. The AlAs barrier and InAs/InGaAs quantum well values are illustrated in Table 2.

TABLE 2

SE-determined layer thicknesses for RTD samples.

| RTD # | Run #- RTD # (1 = top) | Nominal AlAs Thick. (Å) | SE First AlAs Thick. (Å) | SE Second AlAs Thick. (Å) | Nominal Well Thick. (Å) | SE Effective Well Thick. (Å) | Peak Current (mA) | Peak Voltage (mV) |
|---|---|---|---|---|---|---|---|---|
| 1 | 451-4 | 23.4 | 24 | 23.5 | 56.1 | 101.7 | .68 | 100 |
| 2 | 451-3 | 17.6 | 18.8 | 18.5 | 38.4 | 81.1 | 25 | 550 |
| 3 | 451-2 | 17.6 | 19.8 | 19.1 | 38.4 | 41.6 | 22 | 560 |
| 4 | 451-1 | 17.6 | 19.9 | 19.1 | 56.1 | 71.9 | 3.5 | 110 |
| 5 | 462-4 | 23.4 | 24.8 | 24.4 | 38.4 | 62.2 | 5.8 | 400 |
| 6 | 462-3 | 23.4 | 25.5 | 24.9 | 56.1 | 89.7 | .92 | 120 |
| 7 | 462-2 | 23.4 | 25.9 | 25.3 | 38.4 | 61.1 | 4.7 | 350 |
| 8 | 462-1 | 17.6 | 20.5 | 19.8 | 38.4 | 45.1 | 30 | 520 |
| 9 | 466-4 | 17.6 | 19.7 | 19.4 | 50.2 | 79.6 | 13 | 410 |
| 10 | 466-3 | 23.4 | 26.3 | 24.5 | 56.1 | 98.6 | .95 | 120 |
| 11 | 466-2 | 20.4 | 25.6 | 24.6 | 47.2 | 86.3 | 3.5 | 200 |
| 12 | 466-1 | 23.4 | 25.3 | 24.4 | 44.3 | 77.6 | 3.5 | 270 |
| 13 | 467-4 | 20.4 | 23.1 | 22 | 47.2 | 72.0 | 5.5 | 220 |
| 14 | 467-3 | 20.4 | 23.3 | 23.1 | 47.2 | 75.7 | 5.6 | 240 |
| 15 | 467-2 | 20.4 | 22.5 | 21.8 | 47.2 | 73.4 | 6.1 | 250 |
| 16 | 467-1 | 20.4 | 22.3 | 21.9 | 47.2 | 78.4 | 6.2 | 230 |
| 17 | 471-4 | 17.6 | 20.8 | 20.1 | 44.3 | 67.4 | 16 | 270 |
| 18 | 471-3 | 17.6 | 21.5 | 20.3 | 44.3 | 77.7 | 12 | 220 |
| 19 | 471-2 | 23.4 | 25.6 | 25 | 50.2 | 67.9 | 2.5 | 240 |
| 20 | 471-1 | 17.6 | 20.6 | 20 | 38.4 | 43.8 | 36 | 600 |
| 21 | 475-4 | 23.4 | 25.6 | 25.2 | 56.1 | 82.4 | .75 | 110 |
| 22 | 475-3 | 17.6 | 21.7 | 20.8 | 50.2 | 64.8 | 9.5 | 250 |
| 23 | 475-2 | 17.6 | 20.8 | 19.8 | 44.3 | 63.9 | 14 | 390 |
| 24 | 475-1 | 23.4 | 27 | 25.8 | 50.2 | 51.5 | 1.2 | 150 |
| 25 | 482-4 | 23.4 | 28.6 | 26.6 | 56.1 | 92.5 | .75 | 120 |
| 26 | 482-3 | 20.4 | 26.5 | 26.2 | 47.2 | 80.3 | 3.8 | 240 |
| 27 | 482-2 | 20.4 | 24 | 23.9 | 47.2 | 77.0 | 2.4 | 150 |
| 28 | 482-1 | 17.6 | 22.2 | 21.5 | 38.4 | 77.0 | 26 | 490 |
| 29 | 784-4 | 20.4 | 23.2 | 22.2 | 38.4 | 53.2 | 13 | 390 |
| 30 | 784-3 | 20.4 | 23.2 | 23.2 | 53.1 | 67.7 | 4.5 | 220 |
| 31 | 784-2 | 23.4 | 26.2 | 25.3 | 53.1 | 76.3 | 1.2 | 140 |
| 32 | 784-1 | 17.6 | 20.2 | 19.9 | 50.2 | 73.7 | 8.2 | 180 |

Correlation with Device Parameters

The parameters of the RTD structure 412 extracted from post-growth SE analysis were examined for evidence of their predictive ability for RTD device properties. Models or mappings were constructed to relate both the desired target and SE-determined, by measuring, features to various I–V characteristics, for example the electrical properties of $\ln$(peak current $[I_{peak}],I_p$), $\ln$(peak $I_p$/Vp $I_v$, voltage $[V_{peak}]$, $V_p$), and $\ln$(valley current $[I_{valley}],I_v$). The logarithm of the electrical properties are considered because, in theory, an exponential dependence is predicted for the peak and valley currents and the peak voltage on barrier layer and quantum well thicknesses. Modeling techniques including standard linear regression, backpropagation, radial basis functions, and fuzzy regression trees. With a limited sample set (28 samples with 8 growth variables), a linear model may provide the best results in predicting device parameters of future devices to be grown. The I–V characteristics may be sensitive to other parameters other than variations in the AlAs, InAs and InGaAs thicknesses. These thickness appear to provide for the most significant variations in the electrical parameters.

Figure 21:
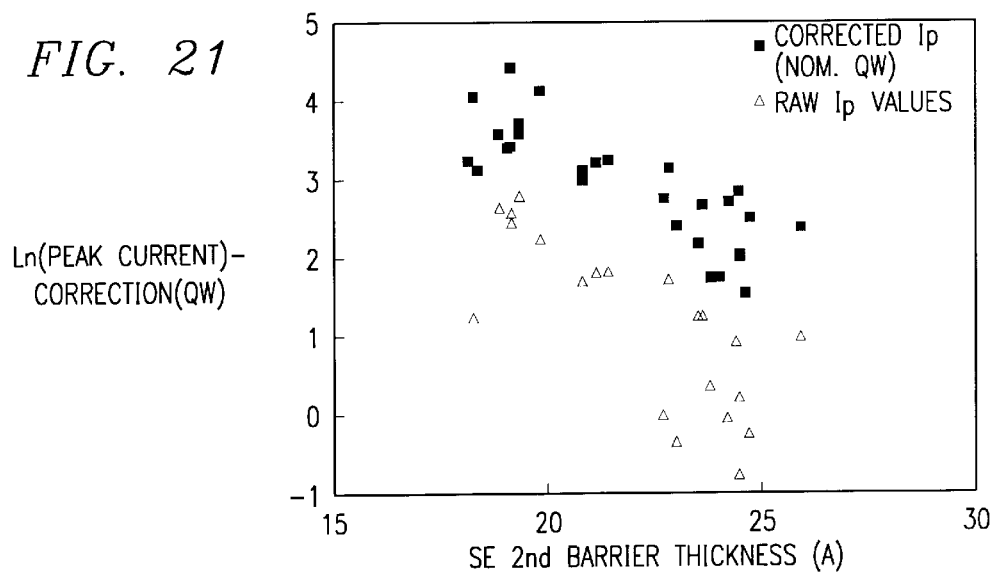
FIG. 21 illustrates the peak current data corrected for variation in quantum well thickness.

FIG. 21 illustrates raw uncorrected $I_P$ related to the thickness of the second barrier. Use of the linear model for peak current is shown in FIG. 8. The raw data does not show the expected linear dependence of $\ln(I_{peak})$ on barrier thickness, because the data contained variations in the quantum well thickness, which also affect the peak current. The raw data is scaled (using the linear model and nominal well thicknesses) to produce corrected $I_P$ data based on a common quantum well value (13 ML). The linear trend is more apparent with the corrected $I_P$ data. Model parameters and predictions for an independent 4-RTD test sample are summarized in Table 3.

$I_p$, $I_v$ and $V_p$

Coefficients for two-parameter model given by: $\ln(P_i)=w0_i+(w1_i*Q^{AlAs})+(w2_i*Q^{QWell})$, where the $P_i$ are the RTD electrical properties, and $Q^{AlAs}$ and $Q^{QWell}$ are the normalized thicknesses of AlAs barriers and InGas/InAs quantum wells, respectively. The Q parameters range from 0 to 1 as the thicknesses span the minimum to maximum of their respective values.

TABLE 4

| Model Coefficient | $I_{peak}$ | $I_{valley}$ | $V_{peak}$ |
|---|---|---|---|
| w0 | 3.62 | 0.64 | 6.43 |
| w1 | −1.64 | −1.61 | −0.27 |
| w2 | −0.93 | −0.28 | −0.62 |

Figure 9:
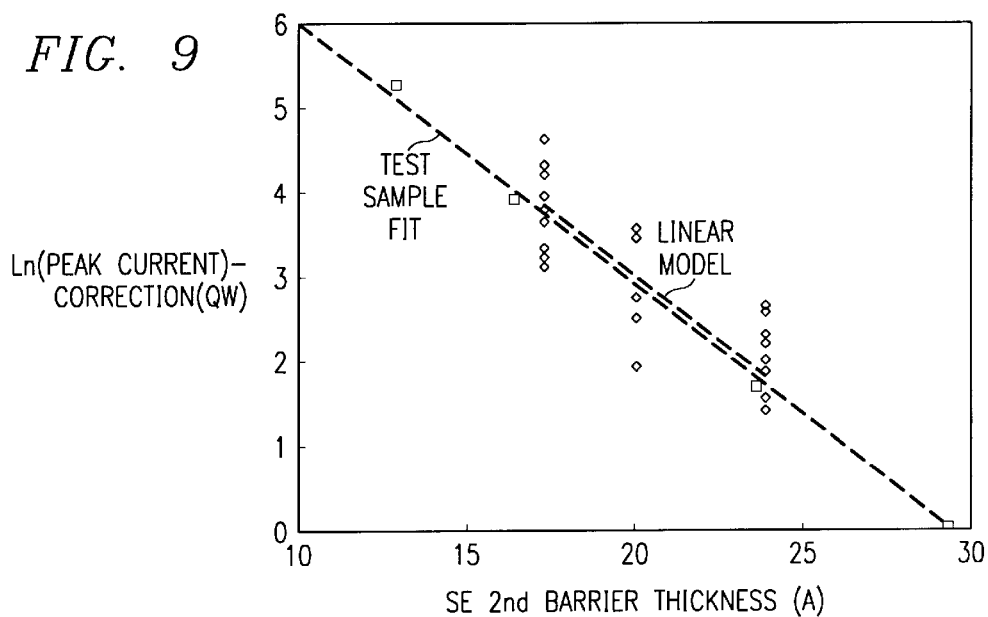
FIG. 9 illustrates a linear model of the present invention.

These parameters were obtained by linear modeling such as illustrated in FIG. 9. Since the same modeling techniques were used for all of the electrical characterization considered, Equation 1 illustrates a generalized equation for a specific electrical characteristic when used in conjunction with the model coefficient in Table 4.

The table combined with the generalized equation is the process model.

$$\ln(P_i) = wo_i + \left(\frac{wl_i}{2}\right) \times Q^{AlAs(first)} + \left(\frac{wl_i}{2}\right) \times Q^{AlAs(second)} + w2_i \times Q^{Qwell} \qquad \text{Equation 1}$$

TABLE 3

Linear model predictions compared with observed values. The predictions were based on the two-parameter model parameters given in Table 4.

| RTD # | Run #- RTD # (1 = top) | ln ($I_{peak}$) Measured | ln ($I_{peak}$) Predicted | ln ($I_{valley}$) Measured | ln ($I_{valley}$) Predicted | ln ($V_{peak}$) Measured | ln ($V_{peak}$) Predicted |
|---|---|---|---|---|---|---|---|
| 29 | 784-4 | 2.60 | 2.49 | −0.27 | −0.26 | 5.97 | 6.09 |
| 30 | 784-3 | 1.51 | 0.95 | −0.60 | −0.72 | 5.39 | 5.06 |
| 31 | 784-2 | 0.15 | 0.13 | −1.43 | −1.53 | 4.94 | 4.92 |
| 32 | 784-1 | 2.10 | 2.00 | 0.26 | 0.18 | 5.19 | 5.40 |

Figure 22:
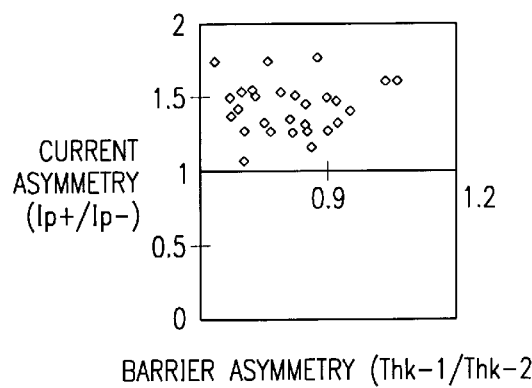
FIG. 22 illustrates the current asymetry as compared with AlAs thickness asymetry.

FIG. 22 illustrates the observed current asymmetry, which is plotted vs. barrier thickness asymmetry in FIG. 9 and defined as $Ip^+/Ip^-$, where $Ip^+$ and $Ip^-$ are the peak currents under forward- or reverse-bias, respectively. This current asymmetry has not been placed in the present model but could be added to the model to achieve more accurate results. The current asymmetry appears to correlate with the barrier thickness asymmetry, since all observed data points are located in the upper right quadrant of FIG. 22. Since $Ip^+$ is used to describe current flow from surface toward the substrate, this is consistent with initial tunneling through a thinner top barrier, as determined by SE. Other effects (e.g., interface roughness), which are not directly measured, may also play a role in determining the peak current asymmetry.

Table 4 illustrates model coefficients for various electrical characteristics including where P is the electrical properties, $W0_i$, W1 and W2 are often from the model. $Q^{AlAs}$ and $Q^{Qwell}$ are thickness of the AlAs barriers and InGaAs/InAs quantum wells, respectively.

Figure 7:
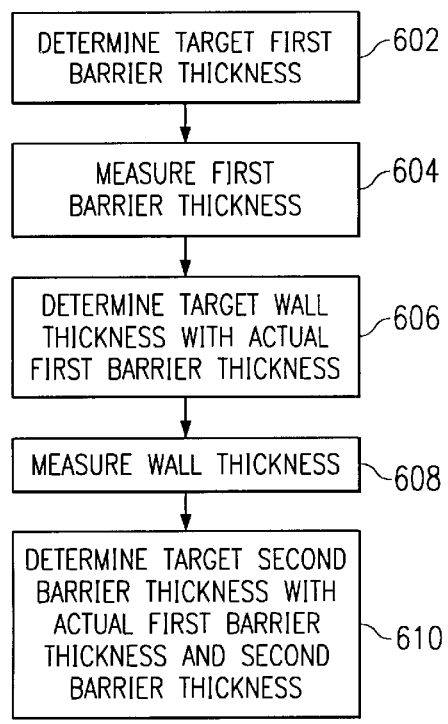
FIG. 7 shows an additional process step of the present invention.

FIG. 7 illustrates the operation of the system. After the buffer layers have been grown (430, 432 and 434), the effusion cell shutters are opened by signals from the controller 201 to grow the first barrier of the RTD device. The shutters are opened for a predetermined period of time in order to grow the first barrier thickness. The controller 202 determines the target first barrier thickness of first barrier 402 by employing equation 2.

As the RTD device is grown layer by layer, the layers of the RTD device that have not yet been grown have target values for the thickness that will provide the known electrical characteristics for the RTD structure. The layers of the RTD device that already have been grown have thicknesses that are known by measurement.

$$\ln(P_i) - wo_i - \left(\frac{wI_i}{2}\right) \times Q^{AlAs(second)} - w2'_i \times Q^{Qwell} = \left(\frac{wI_i}{2}\right) \times Q^{AlAs(first)} \qquad \text{Equation 2}$$

$$\underset{\text{known}}{} \qquad \underset{\text{target}}{} \qquad \underset{\text{target}}{} \qquad \underset{\text{target}}{} \qquad \underset{\text{to be grown}}{}$$

Equation 2 illustrates that the $\ln(P_i)$ is known as a desired coefficient electrical characteristic while the remaining terms on the left side of the equation are target values. These target values are treated as known values in order to obtain the thickness of the first barrier. Target values, then, in this sense can be treated as known in determining the left side of the equation. The results yield a target first barrier thickness. Using this first barrier thickness, the controller controls the opening of the effusion cell shutters in order to build the first barrier 402 as illustrated in Step 602 of FIG. 7.

The controller 202 controls by transmitting additional signals to the spectroscopic elipsometer SE to measure the now-deposited first barrier layer 402 as illustrated in Step 604. These measured values are now transmitted to the controller 202. The controller 202 now recalculates the target thickness of the quantum well 404 through equation 3.

$$\ln(P_i) - wo_i - \left(\frac{wI_i}{2}\right) \times Q^{AlAs(first)} - \left(\frac{wI_i}{2}\right) \times Q^{AlAs(second)} = w2'_0 \times Q^{Qwell} \qquad \text{Equation 3}$$

$$\underset{\text{known}}{} \qquad \underset{\text{known}}{} \qquad \underset{\text{target}}{} \qquad \underset{\text{to be grown}}{}$$

Once the thickness is determined as in Step 606, the controller 202 controls the effusion cell shutters as before to grow the quantum well 404 in accordance with the calculated thickness of the quantum well the measured thickness of the first barrier layer 402. Once the target thickness of the quantum well 404 has been reached through growth, the controller 202 operates the spectroscopic elipsometer to measure the thickness of the quantum well 404 as in Step 608. These measured values are now transmitted to the controller 202.

$$\ln(P_i) - wo_i - \left(\frac{wI_i}{2}\right) \times Q^{AlAs(first)} - w2'_i \times Q^{Qwell} = \left(\frac{wI_i}{2}\right) \times Q^{QAlAs(second)} \qquad \text{Equation 4}$$

$$\underset{\text{known}}{} \qquad \underset{\text{known}}{} \qquad \underset{\text{known}}{} \qquad \underset{\text{to be grown}}{}$$

Equation 4 is used with the controller 202 in order to determine target thickness of the second barrier 406. Thus the controller 202 controls the effusion cell shutters in order to grow the second barrier 406 in accordance with the calculated thickness of the second barrier and the measured thickness of both the first barrier and the quantum well. Thus, an RID device 410 is achieved that is able to provide accurate electrical characteristics. The effect on the electrical characteristics of each thickness of the first barrier, the quantum well and the second barrier is improved since, as these layers are grown, the thickness can be determined and the effect on the final characteristic can be achieved by adjusting the thickness of subsequent layers.

Figure 10:
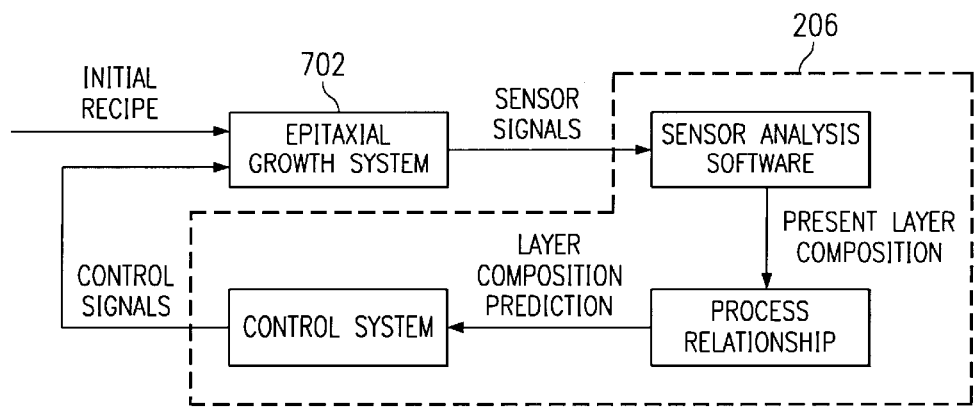
FIG. 10 illustrates in block diagram form the feedback apparatus of the present. invention.

FIG. 10 illustrates that the target values for all of the layers are fed to the epitaxial growth system 702. The epitaxial growth system 702 outputs sensor signals corresponding to the actual growth of one of the layers to be grown. The controller 206 performs sensor analysis through software to determine the layer thickness that should have been grown. The controller 206 obtains specifications of layers to be grown subsequently by using the process model. The controller then operates the cells shutters to grow the next growth layer.

Although the present invention has been described in terms of an RTD structure and RID devices, the method of the present invention is intended to be extended to other multi-layer structures including the electronic devices of PBEMT, HBT and HFET, optical. structures including interference fillers, anti reflection coatings and other multi-layer mirror structures and laser structures with and without Bragg reflectors.

As the RTD device is grown layer by layer, the layers of the RTD device that have not yet been grown have target values for the thickness that will provide the known electrical characteristics for the RTD structure. The layers of the RTD device that already have been grown have thicknesses that are known by measurement.

What is claimed is:

1. An apparatus for molecular beam epitaxy layer growth by using a process model of non-thickness data having model data relating to layer growth, comprising:

a MBE growth chamber for directing a first beam of a first growth species at a wafer in a growth chamber to grow a first layer of said first growth species;

a mass spectrometer for measuring the flux of the reflection of said first beam from said wafer to obtain a first thickness measurement of said first layer;

a controller for comparing said first thickness measurement with said process model of non-thickness data based on said model data relating to said layer growth and to obtain second target thickness of a second layer to be grown;

said MBE growth chamber directing a beam of a second growth species at said wafer in said growth chamber; and said MBE growth chamber terminating said second beam of said second growth species when said second target thickness has been reached in response to said controller.

2. A apparatus as in claim 1, wherein said controller controls said MBE growth chamber to control the temperature of said growth chamber to change the thickness of said first layer.

3. An apparatus as in claim 1, wherein said controller controls said MBE growth chamber based on said process model of electrical characteristics of said first layer.

4. An apparatus as in claim 1, wherein said controller controls said growth chamber based on said process model of valley current data of said first layer.

5. An apparatus as in claim 1, wherein said controller controls said growth chamber based on said process model of peak current data of said first layer.

6. An apparatus as in claim 1, wherein said controller controls said growth chamber based on said process model of peak voltage data of said first layer.

* * * * *